United States Patent
Harada et al.

(10) Patent No.: US 10,322,549 B2
(45) Date of Patent: Jun. 18, 2019

(54) PROCESSING METHOD

(71) Applicant: DISCO CORPORATION, Tokyo (JP)

(72) Inventors: Shigenori Harada, Tokyo (JP); Mana Eritate, Tokyo (JP)

(73) Assignee: Disco Corporation, Tokyo (JP)

( * ) Notice: Subject to any disclaimer, the term of this patent is extended or adjusted under 35 U.S.C. 154(b) by 254 days.

(21) Appl. No.: 15/295,691

(22) Filed: Oct. 17, 2016

(65) Prior Publication Data

US 2017/0113420 A1    Apr. 27, 2017

(30) Foreign Application Priority Data

Oct. 23, 2015  (JP) .................................. 2015-209006

(51) Int. Cl.
| | |
|---|---|
| B29C 39/02 | (2006.01) |
| B29C 59/00 | (2006.01) |
| B29C 69/00 | (2006.01) |
| B29D 11/00 | (2006.01) |
| B29L 11/00 | (2006.01) |
| H01L 41/338 | (2013.01) |

(52) U.S. Cl.
CPC .......... B29C 69/001 (2013.01); B29C 39/026 (2013.01); B29C 59/007 (2013.01); B29D 11/0074 (2013.01); H01L 41/338 (2013.01); B29L 2011/00 (2013.01)

(58) Field of Classification Search
CPC ... B29C 69/001; B29C 39/026; B29C 59/007; B29D 11/0074; H01L 41/338
See application file for complete search history.

(56) References Cited

U.S. PATENT DOCUMENTS

| | | | | |
|---|---|---|---|---|
| 4,683,396 A | * | 7/1987 | Takeuchi .............. | B06B 1/0622 310/357 |
| 5,722,156 A | * | 3/1998 | Balfrey .................. | B24B 37/00 125/12 |

FOREIGN PATENT DOCUMENTS

| | | |
|---|---|---|
| JP | 11-318893 | 11/1999 |
| JP | 2009-027052 | 2/2009 |

* cited by examiner

*Primary Examiner* — Kelly M Gambetta
(74) *Attorney, Agent, or Firm* — Greer Burns & Crain, Ltd.

(57) ABSTRACT

Disclosed herein is a processing method for forming a plurality of quadrangular prisms on a plate-shaped substrate having a product area. The processing method includes the steps of preparing an excess-sized plate-shaped substrate having an excess area surrounding the product area, cutting the excess-sized plate-shaped substrate in a first direction by using a cutting blade to thereby form a first cut groove extending in the first direction, cutting the excess-sized plate-shaped substrate in a second direction perpendicular to the first direction by using the cutting blade to thereby form a second cut groove extending in the second direction, filling the first cut groove and the second cut groove with a resin, and cutting the excess-sized plate-shaped substrate along the boundary between the product area and the excess area by using the cutting blade to thereby remove the excess area from the excess-sized plate-shaped substrate.

3 Claims, 7 Drawing Sheets

FIRST DIRECTION    SECOND DIRECTION

PROCESSING METHOD

BACKGROUND OF THE INVENTION

Field of the Invention

The present invention relates to a processing method for forming a plurality of cut grooves on a plate-shaped substrate to form a plurality of quadrangular prisms.

Description of the Related Art

In an ultrasonic probe, scintillator, etc. using a piezoelectric element (piezoelectric ceramics), a configuration formed by arranging a plurality of minute quadrangular prisms is known (see Japanese Patent Laid-open No. 1999-318893, for example). As a method for forming a plurality of such quadrangular prisms, there is a method including the steps of slicing a plate-shaped substrate in a first direction plural times to form a plurality of portions spaced at given intervals and next slicing the plate-shaped substrate in a second direction perpendicular to the first direction plural times to form a plurality of portions spaced at given intervals. This slicing operation is performed by using a cutting apparatus disclosed in Japanese Patent Laid-open No. 2009-27052, for example. In this cutting apparatus, a cutting blade is rotated at a high speed to cut the plate-shaped substrate. The cutting blade and the plate-shaped substrate are relatively moved to thereby slice the plate-shaped substrate. By performing this slicing operation, a plurality of crossing cut grooves are formed on the plate-shaped substrate to thereby form the plural quadrangular prisms.

In the configuration described in Japanese Patent Laid-open No. 1999-318893 mentioned above, first cut grooves are formed by slicing a plate-shaped substrate in a first direction, and these first cut grooves are next filled with a resin. Thereafter, the plate-shaped substrate is rotated 90 degrees to perform slicing and thereby form second cut grooves extending in a second direction perpendicular to the first direction. In the case that the plate-shaped substrate is formed of brittle material as in an ultrasonic probe, scintillator, etc., the rigidity of the plate-shaped substrate is increased by filling the first cut grooves with the resin. Thereafter, the plate-shaped substrate is rotated 90 degrees to perform slicing and thereby form the second cut grooves. As a result, the plural minute quadrangular prisms are formed.

SUMMARY OF THE INVENTION

However, each quadrangular prism has a height considerably greater than the dimensions in the first direction and the second direction. In other words, each quadrangular prism has a large aspect ratio. Accordingly, there is a case that some of the quadrangular prisms may fall due to the blast of a cutting water in cutting the plate-shaped substrate on one side of the plate-shaped substrate where the cutting blade passes near the end of cutting. These quadrangular prisms that have fallen cannot exhibit the function as a probe or scintillator and they are unusable as a product.

It is therefore an object of the present invention to provide a processing method which can suppress falling of the quadrangular prisms formed by the plural deep cut grooves on the plate-shaped substrate.

In accordance with an aspect of the present invention, there is provided a processing method for forming a plurality of quadrangular prisms on a plate-shaped substrate having a product area, including an excess-sized plate-shaped substrate preparing step of preparing an excess-sized plate-shaped substrate having an excess area surrounding the product area; a first cut groove forming step of cutting the excess-sized plate-shaped substrate in a first direction by using a cutting blade after performing the excess-sized plate-shaped substrate preparing step, thereby forming a first cut groove extending in the first direction; a second cut groove forming step of cutting the excess-sized plate-shaped substrate in a second direction perpendicular to the first direction by using the cutting blade after performing the first cut groove forming step, thereby forming a second cut groove extending in the second direction; a resin filling step of filling the first cut groove and the second cut groove with a resin after performing the second cut groove forming step; and an excess area removing step of cutting the excess-sized plate-shaped substrate along the boundary between the product area and the excess area by using the cutting blade after performing the resin filling step, thereby removing the excess area from the excess-sized plate-shaped substrate.

According to this method, the excess-sized plate-shaped substrate has the excess area surrounding the product area. After forming the first and second cut grooves on the excess-sized plate-shaped substrate to thereby form the plural quadrangular prisms, the excess area is removed by cutting the excess-sized plate-shaped substrate. Accordingly, by forming the excess area on one side of the plate-shaped substrate where the cutting blade passes near the end of cutting, it is possible to prevent the quadrangular prisms formed in the product area from falling. That is, it is possible to avoid that any quadrangular prisms unusable as a product may be formed.

Preferably, the first cut groove extends from one side edge of the product area to a position inside the excess area, thereby leaving a first uncut portion in the excess area; and the second cut groove extends from another side edge of the product area to a position inside the excess area, thereby leaving a second uncut portion in the excess area.

As a modification, the first cut groove extends from a position inside the excess area on one side of the first direction to a position inside the excess area on the other side of the first direction, thereby leaving a pair of first uncut portions in the excess area on the opposite sides of the first direction; and the second cut groove extends from a position inside the excess area on one side of the second direction to a position inside the excess area on the other side of the second direction, thereby leaving a pair of second uncut portions in the excess area on the opposite sides in the second direction.

According to the present invention, the excess area surrounding the product area is formed and this excess area is removed after forming the cut grooves. Accordingly, it is possible to suppress falling of the quadrangular prisms formed by the plural deep cut grooves on the plate-shaped substrate.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

First Preferred Embodiment

Figure 1A:
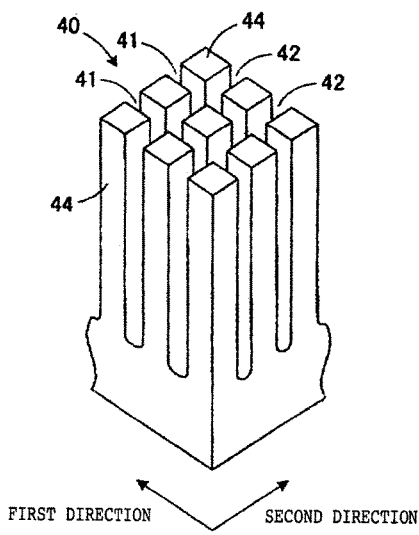
FIG. 1A is a schematic perspective view of a part of a piezoelectric element produced by the processing method of the present invention.

A processing method for producing a piezoelectric element according to a first preferred embodiment of the present invention will now be described with reference to the attached drawings. First, a piezoelectric element 40 produced by the processing method will now be described with reference to FIG. 1A. FIG. 1A is a schematic perspective view of a part of the piezoelectric element 40 produced by the processing method.

As shown in FIG. 1A, the piezoelectric element 40 has a plurality of first cut grooves 41 extending in a first direction and arranged at given intervals and a plurality of second cut grooves 42 extending in a second direction perpendicular to the first direction and arranged at given intervals. By forming the first cut grooves 41 and the second cut grooves 42, the piezoelectric element 40 has a plurality of quadrangular prisms 44 arranged in the first direction and the second direction. Each quadrangular prism 44 has a height considerably greater than the dimensions in the first direction and the second direction. In other words, each quadrangular prism 44 has a large aspect ratio, e.g., approximately 10 to 27.

Figure 1B:
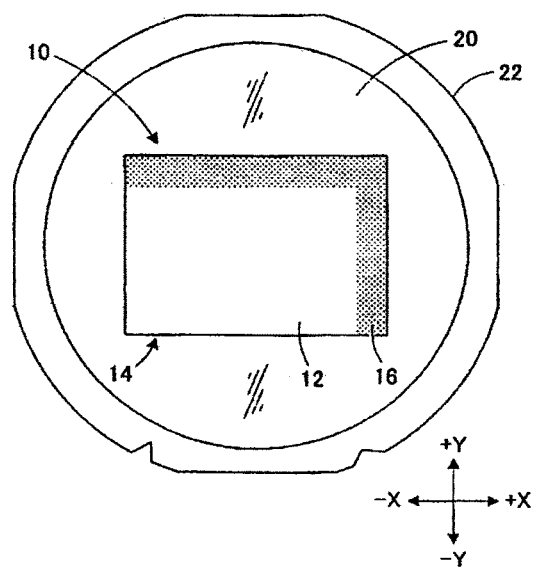
FIG. 1B is a plan view for illustrating an excess-sized plate-shaped substrate preparing step according to a first preferred embodiment of the present invention.
Figure 2:
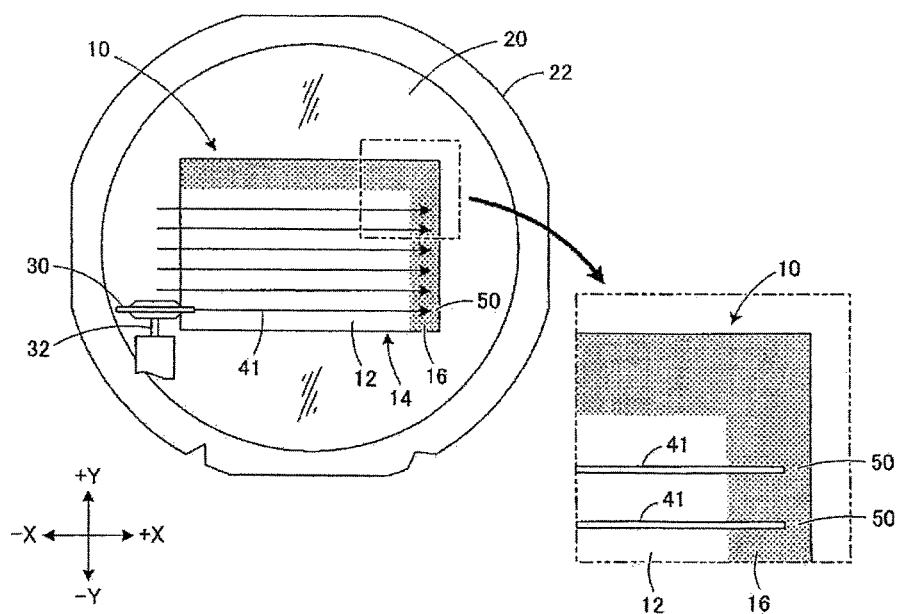
FIG. 2 is a plan view for illustrating a first cut groove forming step according to the first preferred embodiment.
Figure 3:
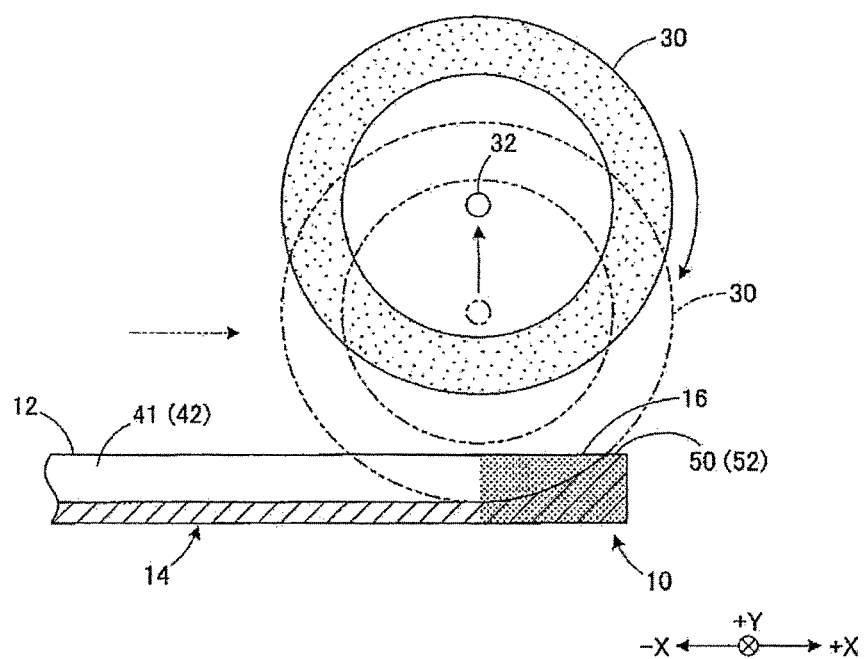
FIG. 3 is a sectional view for illustrating the first cut groove forming step and a second cut groove forming step according to the first preferred embodiment.
Figure 4:
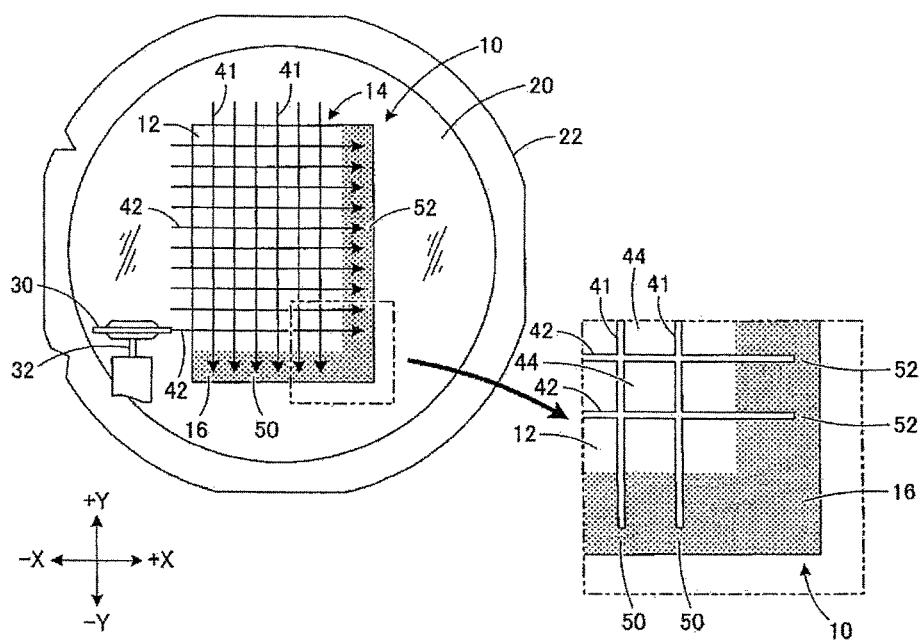
FIG. 4 is a plan view for illustrating the second cut groove forming step according to the first preferred embodiment.
Figure 5:
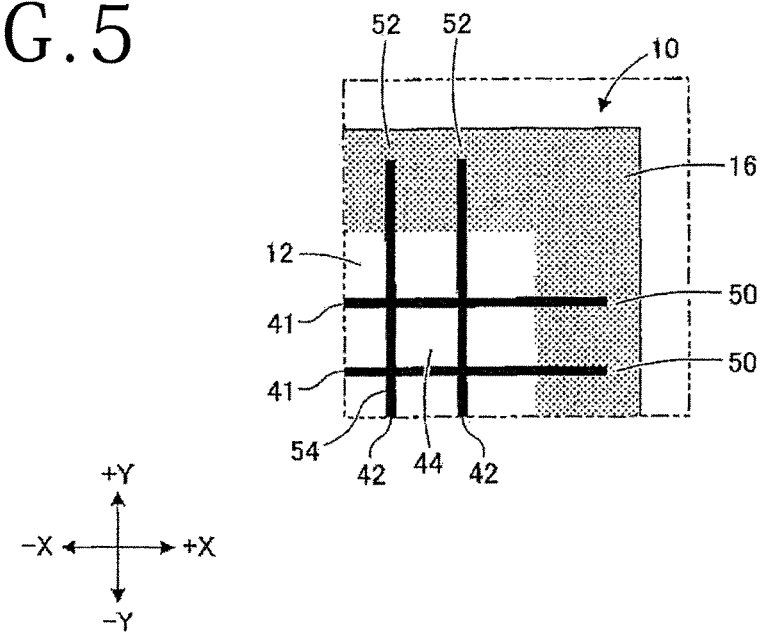
FIG. 5 is a plan view for illustrating a resin filling step according to the first preferred embodiment.
Figure 6:
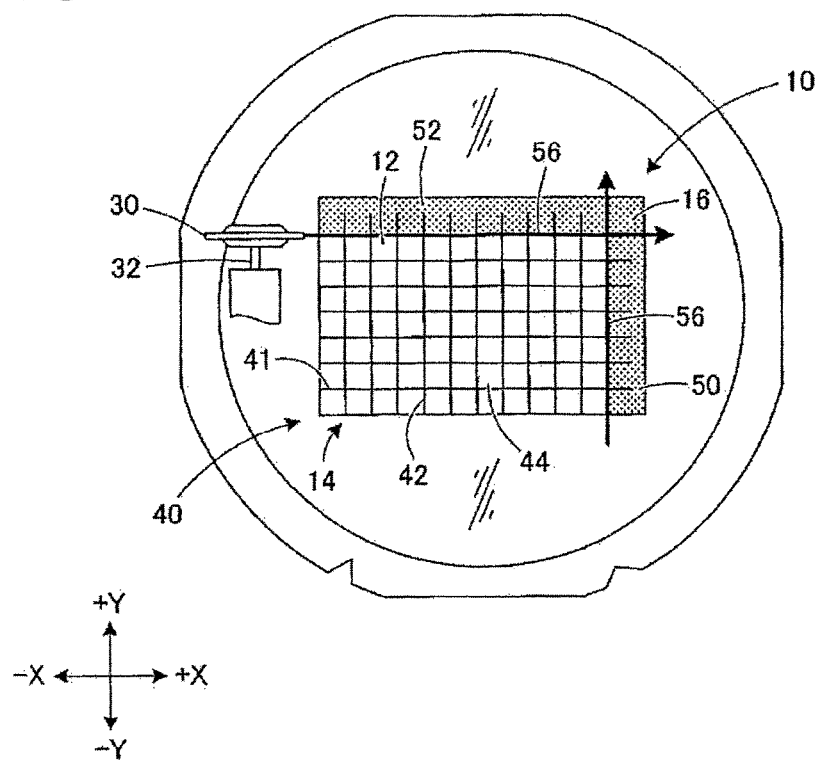
FIG. 6 is a plan view for illustrating an excess area removing step according to the first preferred embodiment.

The processing method according to the first preferred embodiment will now be described with reference to FIG. 1B and FIGS. 2 to 6. FIG. 1B is a plan view for illustrating an excess-sized plate-shaped substrate preparing step, FIG. 2 is a plan view for illustrating a first cut groove forming step, FIG. 3 is a sectional view for illustrating the first cut groove forming step and a second cut groove forming step, FIG. 4 is a plan view for illustrating the second cut groove forming step, FIG. 5 is a plan view for illustrating a resin filling step, and FIG. 6 is a plan view for illustrating an excess area removing step. These steps are merely illustrative and the steps of the present invention are not limited to these steps.

As shown in FIG. 1B, the excess-sized plate-shaped substrate preparing step is performed to prepare an excess-sized plate-shaped substrate 10. The excess-sized plate-shaped substrate 10 is formed by preparing a piezoelectric element substrate (not shown) having a planar size larger than that of the excess-sized plate-shaped substrate 10 and then cutting this piezoelectric element substrate into a rectangular shape. The excess-sized plate-shaped substrate 10 includes a rectangular plate-shaped substrate 14 having a rectangular product area 12. The excess-sized plate-shaped substrate 10 further includes an L-shaped excess area 16 formed so as to partially surround the product area 12 of the plate-shaped substrate 14. In this preferred embodiment, the whole area of the upper surface of the plate-shaped substrate 14 is formed as the product area 12. As shown in FIG. 1B, the product area 12 has a rectangular shape, and a shaded area having a predetermined width is formed adjacent to the product area 12 on its +X side and its +Y side as the excess area 16.

Accordingly, in the excess-sized plate-shaped substrate preparing step, the piezoelectric element substrate (not shown) is first cut into a rectangular shape larger in planar size than that of the rectangular plate-shaped substrate 14, thus obtaining the rectangular excess-sized plate-shaped substrate 10. The rectangular plate-shaped substrate 14 having the product area 12 includes two adjacent sides perpendicular to each other, which are common to the two adjacent sides of the rectangular excess-sized plate-shaped substrate 10 on the −X side and the −Y side thereof. Further, the excess area 16 (shaded area) having a predetermined width is formed along the other two adjacent sides of the rectangular plate-shaped substrate 14 on the +X side and the +Y side thereof. The shade of the excess area 16 in FIG. 1B is shown for convenience in visually recognizing the excess area 16 as distinguished from the product area 12. In this preferred embodiment, the excess area 16 is the same as the product area 12 in material and structure. However, the excess area 16 may be different in material and structure from the product area 12.

The excess-sized plate-shaped substrate 10 is attached to an adhesive tape 20 at its central portion. The peripheral portion of the adhesive tape 20 is attached to an annular frame 22. Accordingly, the excess-sized plate-shaped substrate 10 is supported through the adhesive tape 20 to the annular frame 22.

After performing the excess-sized plate-shaped substrate preparing step, the first cut groove forming step is performed to cut the excess-sized plate-shaped substrate 10 by using a cutting blade 30 as shown in FIGS. 2 and 3. The cutting blade 30 is mounted on a rotatable spindle 32 at its front end. Although not shown, a nozzle for discharging a cutting water is provided in the vicinity of the cutting blade 30. During a cutting operation, a cutting water is discharged from this nozzle to an area being cut by the cutting blade 30.

In performing the first cut groove forming step, the excess-sized plate-shaped substrate 10 is held through the adhesive tape 20 on a chuck table (not shown) under suction. The chuck table is movable in the X direction by a feeding mechanism (not shown). The chuck table is also rotatable about its vertical axis.

After holding the excess-sized plate-shaped substrate 10 on the chuck table under suction, alignment of the excess-sized plate-shaped substrate 10 is performed. That is, the first direction (see FIG. 1A) as the direction of extension of the first cut grooves 41 is made parallel to the feeding direction (X direction) by suitably rotating the chuck table holding the excess-sized plate-shaped substrate 10. In this preferred embodiment, the feeding direction extends from the −X side to the +X side. That is, the cutting blade 30 is moved relative to the chuck table in the +X direction extending from the −X side to the +X side (Actually, the chuck table is moved relative to the cutting blade 30 in the −X direction in cutting the excess-sized plate-shaped substrate 10). Accordingly, the excess-sized plate-shaped substrate 10 is positioned so that the excess area 16 is located on the +X side as the downstream end of the feeding direction and the product area 12 is located on the −X side as the upstream side of the feeding direction. Thereafter, the cutting blade 30 is positioned outside of the side edge of the excess-sized plate-shaped substrate 10 on the −X side (positioned on the left side of this side edge as viewed in FIG. 2). Thereafter, the cutting blade 30 being rotated at a high speed is lowered to a vertical position corresponding to a predetermined depth of each first cut groove 41. Thereafter, the excess-sized plate-shaped substrate 10 is fed in the X direction relative to the cutting blade 30, thereby forming a predetermined one of the first cut grooves 41.

In this cutting operation, the cutting blade 30 starts cutting at a position outside of the left side edge of the excess-sized plate-shaped substrate 10 (product area 12) on the −X side at the start of the feeding operation. On the other hand, at the end of the feeding operation, the cutting blade 30 is raised to be separated from the excess-sized plate-shaped substrate 10 at a position inside of the right side edge of the excess-sized plate-shaped substrate 10 on the +X side, i.e., at a position in the excess area 16. Accordingly, the predetermined first cut groove 41 is formed so as to extend from the left side edge of the excess-sized plate-shaped substrate 10 to the position in the excess area 16. That is, an uncut portion 50 where the first cut groove 41 is not formed is left in the excess area 16 between the end of the first cut groove 41 and the right side edge of the excess-sized plate-shaped substrate 10 as viewed in FIG. 2.

After forming the predetermined first cut groove 41, the cutting blade 30 is moved in the indexing direction (+Y direction) by the pitch of the first cut grooves 41, so that the cutting blade 30 is set at a position corresponding to the next first cut groove 41. Thereafter, the feeding operation and the indexing operation are repeated similarly to sequentially form the plural first cut grooves 41 on the excess-sized plate-shaped substrate 10.

After performing the first cut groove forming step, the second cut groove forming step is performed to similarly cut the excess-sized plate-shaped substrate 10 by using the cutting blade 30 as shown in FIGS. 3 and 4. First, the excess-sized plate-shaped substrate 10 (the chuck table holding the plate-shaped substrate 10) is rotated 90 degrees to make the second direction (see FIG. 1A) as the direction of extension of the second cut grooves 42 parallel to the feeding direction (X direction). In this condition, the excess-sized plate-shaped substrate 10 is positioned so that the excess area 16 is located on the +X side as the downstream end of the feeding direction and the product area 12 is located on the −X side as the upstream side of the feeding direction. Thereafter, a cutting operation is performed in a manner similar to that of the first cut groove forming step, thereby forming the plural second cut grooves 42 intersecting at right angles to the plural first cut grooves 41. Also in the second cut groove forming step, an uncut portion 52 where each second cut groove 42 is not formed is left in the excess area 16 between the end of each second cut groove 42 and the right side edge of the excess-sized plate-shaped substrate 10 as viewed in FIG. 4. By performing the second cut groove forming step, each quadrangular prism 44 is formed by the adjacent first cut grooves 41 and the adjacent second cut grooves 42.

After performing the second cut groove forming step, the resin filling step is performed to fill the first cut grooves 41 and the second cut grooves 42 with a resin 54 such as a filler as shown in FIG. 5. Preferably, the resin 54 is a soft material that does not interfere with expansion and contraction of each quadrangular prism 44. Further, the resin 54 functions to improve the strength of each quadrangular prism 44.

After performing the resin filling step, the excess area removing step is performed to remove the excess area 16 as shown in FIG. 6. First, the direction of extension of a first boundary 56a between the product area 12 and the excess area 16 is made parallel to the feeding direction (X direction) by suitably rotating the chuck table as shown in FIG. 6. Thereafter, the cutting blade 30 is positioned outside of the side edge of the excess-sized plate-shaped substrate 10 on the −X side (positioned on the left side of this side edge as viewed in FIG. 6). Thereafter, the cutting blade 30 being rotated at a high speed is lowered to a vertical position corresponding to a predetermined depth of cut of the adhesive tape 20 (i.e., a vertical position such that the excess-sized plate-shaped substrate 10 is to be fully cut). Thereafter, the excess-sized plate-shaped substrate 10 is fed in the X direction relative to the cutting blade 30, thereby cutting the excess-sized plate-shaped substrate 10 along the first boundary 56a. That is, the excess-sized plate-shaped substrate 10 is divided into two parts in the Y direction.

Thereafter, the excess-sized plate-shaped substrate 10 (the chuck table holding the plate-shaped substrate 10) is rotated 90 degrees to make the direction of extension of a second boundary 56b between the product area 12 and the excess area 16 parallel to the feeding direction (X direction), wherein the second boundary 56b is perpendicular to the first boundary 56a. Thereafter, a cutting operation is similarly performed to cut the excess-sized plate-shaped substrate 10 along the second boundary 56b. Accordingly, the excess-sized plate-shaped substrate 10 is further divided into two parts, so that the excess area 16 is completely removed from the excess-sized plate-shaped substrate 10 to obtain the piezoelectric element 40 including the plate-shaped substrate 14 and the plural quadrangular prisms 44 formed on the plate-shaped substrate 14.

According to the first preferred embodiment, the excess area 16 is formed at the downstream end of the feeding direction in forming the first and second cut grooves 41 and 42. Accordingly, the excess area 16 is cut continuously from the cutting of the plate-shaped substrate 14 (product area 12) by the cutting blade 30. That is, in cutting the product area 12, the cutting blade 30 does not pass beyond the side edge of the excess-sized plate-shaped substrate 10 at the downstream end of the feeding direction, so that it is possible to prevent the all the quadrangular prisms 44 formed in the product area 12 from falling due to the blast of a cutting water discharged from the nozzle. Accordingly, all the quadrangular prisms 44 can be formed into the piezoelectric element 40 that may function as an ultrasonic probe. That is, as compared with the prior art wherein the quadrangular prisms may fall at the downstream end of the feeding direction in forming the cut grooves 41 and 42, the product area 12 can be made wider.

Further, the uncut portions 50 and 52 are left in the excess area 16. Accordingly, also in cutting the excess area 16, the cutting blade 30 does not pass beyond the side edge of the excess-sized plate-shaped substrate 10. As a result, it is possible to avoid falling of a portion surrounded by the adjacent cut grooves 41 and 42, thereby preventing falling of each quadrangular prism 44 more reliably. If the cutting blade 30 passes beyond the side edge of the excess-sized plate-shaped substrate 10, any chip-shaped dust may scatter from the side edge of the plate-shaped substrate 10. To the contrary, by leaving the uncut portions 50 and 52 according to this preferred embodiment, such scattering of chip-shaped dust can be avoided. As a result, it is possible to prevent the chip-shaped dust scattered from coming into contact with the cutting blade 30 being rotated at a high speed, causing damage to the cutting blade 30.

Second Preferred Embodiment

Figure 7:
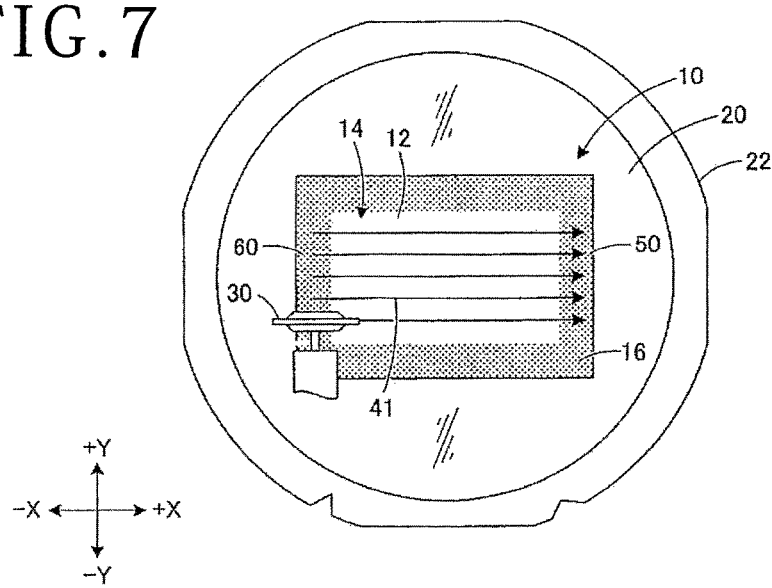
FIG. 7 is a plan view for illustrating an excess-sized plate-shaped substrate preparing step and a first cut groove forming step according to a second preferred embodiment of the present invention.
Figure 8:
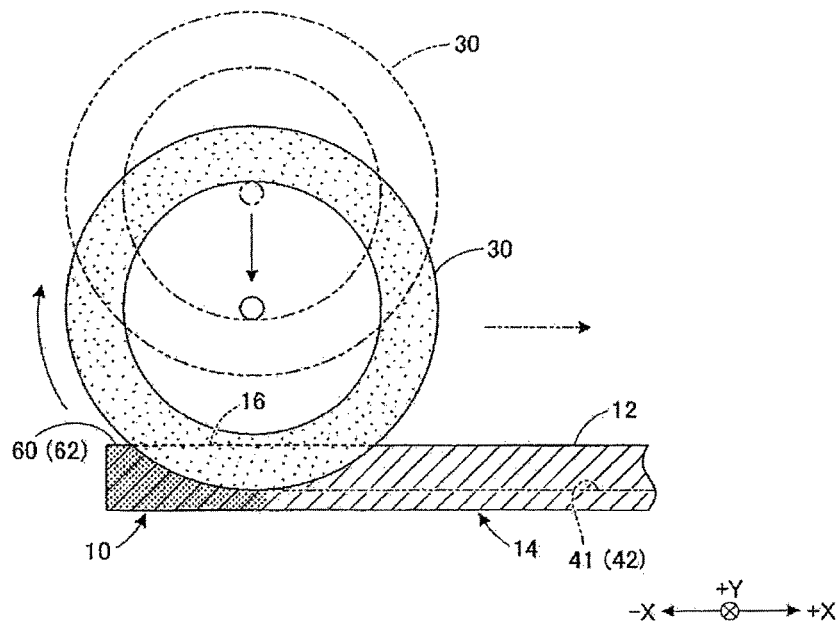
FIG. 8 is a sectional view for illustrating the first cut groove forming step and a second cut groove forming step according to the second preferred embodiment.
Figure 9:
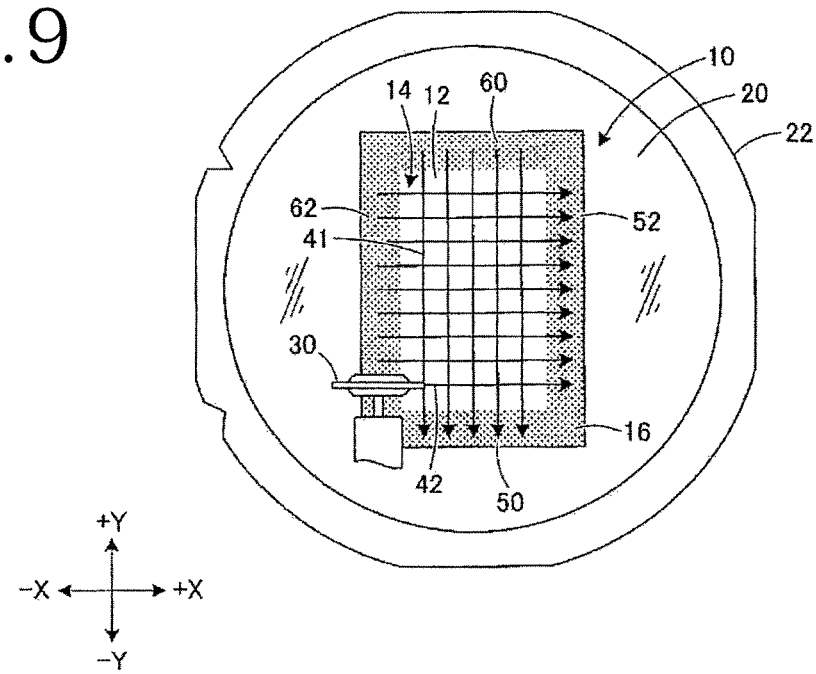
FIG. 9 is a plan view for illustrating the second cut groove forming step according to the second preferred embodiment.
Figure 10:
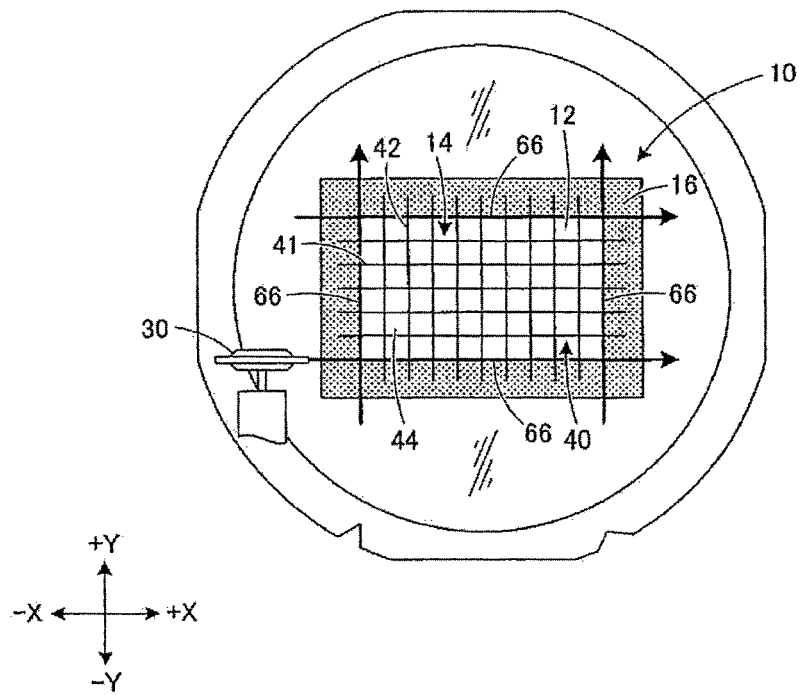
FIG. 10 is a plan view for illustrating an excess area removing step according to the second preferred embodiment.

A second preferred embodiment will now be described with reference to FIGS. 7 to 10. FIGS. 7 to 10 illustrate a processing method according to the second preferred embodiment. FIG. 7 is a plan view for illustrating an excess-sized plate-shaped substrate preparing step and a first cut groove forming step, FIG. 8 is a sectional view for illustrating the first cut groove forming step and a second cut groove forming step, FIG. 9 is a plan view for illustrating the second cut groove forming step, and FIG. 10 is a plan view for illustrating an excess area removing step. In the second preferred embodiment, the components similar to those in the first preferred embodiment are denoted by the same reference symbols, and the description thereof will be omitted.

In the excess-sized plate-shaped substrate preparing step of the processing method according to the second preferred embodiment, an excess-sized plate-shaped substrate 10 is prepared as shown in FIG. 7. In the second preferred embodiment, the excess-sized plate-shaped substrate 10 includes a rectangular product area 12 and a rectangular ring-shaped excess area 16 formed so as to fully surround the product area 12. The product area 12 is formed by the whole area of the upper surface of a plate-shaped substrate 14.

After performing the excess-sized plate-shaped substrate preparing step, the first cut groove forming step is performed as shown in FIGS. 7 and 8. After performing the alignment of the excess-sized plate-shaped substrate 10, the cutting blade 30 is positioned directly above the excess area 16 on the −X side (on one side in the first direction) as shown by a phantom line in FIG. 8. The position of the cutting blade 30 in the Y direction coincides with the position where a predetermined one of the first cut grooves 41 is to be formed. Thereafter, the cutting blade 30 being rotated at a high speed is lowered to a vertical position corresponding to a predetermined depth of each first cut groove 41, thereby cutting the excess area 16 on the −X side. At this time, the cutting blade 30 starts cutting at a position inside of the left side edge of the excess area 16 (the excess-sized plate-shaped substrate 10) on the −X side at the start of the feeding operation. Accordingly, an uncut portion 60 where the first cut groove 41 is not formed is left in the excess area 16 on the −X side between the left side edge of the excess-sized plate-shaped substrate 10 and the start of the first cut groove 41. In the condition where the vertical position of the cutting blade 30 cut into the excess area 16 is maintained, the excess-sized plate-shaped substrate 10 is fed in the X direction relative to the cutting blade 30, thereby forming the predetermined first cut groove 41. As shown in FIG. 7, an uncut portion 50 where the first cut groove 41 is not formed is left in the excess area 16 on the +X side (on the other side in the first direction) between the end of the first cut groove 41 and the right side edge of the excess-sized plate-shaped substrate 10 as similarly to the first preferred embodiment.

Thereafter, the cutting operation is similarly repeated to form the plural first cut grooves 41 on the excess-sized plate-shaped substrate 10.

After performing the first cut groove forming step, the second cut groove forming step is performed in a manner similar to that of the first cut groove forming step, thereby forming the plural second cut grooves 42 intersecting at right angles to the plural first cut grooves 41 as shown in FIG. 9. At this time, uncut portions 52 and 62 are left near the opposite ends of each second cut groove 42. Although the description may be duplicated, the second cut groove forming step will be described more specifically. First, the excess-sized plate-shaped substrate 10 is rotated 90 degrees to make the direction of extension of the second cut grooves 42 (i.e., the second direction shown in FIG. 1A) parallel to the feeding direction (X direction). Thereafter, the cutting blade 30 is positioned directly above the excess area 16 on the −X side (on one side in the second direction). The position of the cutting blade 30 in the Y direction coincides with a position where a predetermined one of the second cut grooves 42 is to be formed. Thereafter, the cutting blade 30 being rotated at a high speed is lowered to a vertical position corresponding to a predetermined depth of each second cut groove 42, thereby cutting the excess area 16 on the −X side. At this time, the cutting blade 30 starts cutting at a position inside of the left side edge of the excess area 16 (the excess-sized plate-shaped substrate 10) on the −X side at the start of the feeding operation. Accordingly, the uncut portion 62 where the second cut groove 42 is not formed is left in the excess area 16 on the −X side between the left side edge of the excess-sized plate-shaped substrate 10 and the start of the second cut groove 42. In the condition where the vertical position of the cutting blade 30 cut into the excess area 16 is maintained, the excess-sized plate-shaped substrate 10 is fed in the X direction relative to the cutting blade 30, thereby forming the predetermined second cut groove 42. As shown in FIG. 9, the uncut portion 52 where the second cut groove 42 is not formed is left in the excess area 16 on the +X side (on the other side in the second direction) between the end of the second cut groove 42 and the right side edge of the excess-sized plate-shaped substrate 10 as similarly to the first preferred embodiment. Thereafter, the cutting operation is similarly repeated to form the plural second cut grooves 42 on the excess-sized plate-shaped substrate 10.

After performing the second cut groove forming step and the resin filling step (not shown, but similar to the step shown in FIG. 5), the excess area removing step is performed as shown in FIG. 10. In the second preferred embodiment, the excess-sized plate-shaped substrate 10 is cut along a pair of first boundaries 66a extending in the first direction and a pair of second boundaries 66b extending in the second direction, by using the cutting blade 30 as similarly to the first preferred embodiment. Accordingly, the excess area 16 is completely removed from the excess-sized plate-shaped substrate 10 to obtain the piezoelectric element 40 including the plate-shaped substrate 14 and the plural quadrangular prisms 44 formed on the plate-shaped substrate 14.

According to the second preferred embodiment, the excess area 16 is formed also at the upstream end of the feeding direction in forming the first and second cut grooves 41 and 42. Accordingly, falling of the quadrangular prisms 44 near the upstream end of the feeding direction can also be more suppressed to thereby further improve the quality of the piezoelectric element 40.

The present invention is not limited to the above preferred embodiments, but various modifications may be made. In the above preferred embodiments, the size, shape, etc. shown in the attached drawings are merely illustrative and they may be suitably changed within the scope where the effect of the present invention can be exhibited. Further, various modifications may be made without departing from the scope of the object of the present invention.

For example, in forming the cut grooves 41 and 42, the uncut portions 50, 52, 60, and 62 may not be left, but the cutting blade 30 may pass beyond the side edge of the excess area 16 (excess-sized plate-shaped substrate 10). In this case, the plural quadrangular prisms 44 are formed in the product area 12, and even if the prism-shaped portion formed in the excess area 16 falls, the quadrangular prisms 44 formed in the product area 12 can be prevented from falling because the excess area 16 is removed.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for forming a plurality of quadrangular prisms on a plate-shaped substrate having a product area, comprising:
    an excess-sized plate-shaped substrate preparing step of preparing an excess-sized plate-shaped substrate having an excess area surrounding said product area;
    a first cut groove forming step of cutting said excess-sized plate-shaped substrate in a first direction by relatively feeding said excess-sized plate-shaped substrate and said cutting blade in the first direction after performing said excess-sized plate-shaped substrate preparing step, thereby forming a first cut groove extending in said first direction;
    a second cut groove forming step of cutting said excess-sized plate-shaped substrate in a second direction perpendicular to said first direction by relatively feeding said excess-sized plate-shaped substrate and said cutting blade in the second direction after performing said first cut groove forming step, thereby forming a second cut groove extending in said second direction;
    a resin filling step of filling said first cut groove and said second cut groove with a resin after performing said second cut groove forming step; and
    an excess area removing step of cutting said excess-sized plate-shaped substrate along the boundary between said product area and said excess area by using said cutting blade after performing said resin filling step, thereby removing said excess area from said excess-sized plate-shaped substrate;
    wherein said cutting blade is raised to be separated from said excess-sized plate-shaped substrate at a position of said excess area at the end of said feeding operation in said first and said second cut groove forming steps.

2. The processing method according to claim 1, wherein said cutting blade starts cutting said excess-sized late-shaped substrate at a position inside of said excess area of said excess-sized plate-shaped substrate.

3. The processing method according to claim 1, wherein the plurality of quadrangular prisms are formed by said first and second cut grooves and remain connected to the plate-shaped substrate at a bottom of said first and second cut grooves after said excess area has been removed in the excess area removing step.

* * * * *